United States Patent [19]

Takahashi et al.

[11] Patent Number: 5,436,449
[45] Date of Patent: Jul. 25, 1995

[54] TRANSMISSION ELECTRON MICROSCOPE AND METHOD OF OBSERVING MAGNETIC PHENOMENA USING ITS APPARATUS

[75] Inventors: Yoshio Takahashi, Kunitachi; Yusuke Yajima, Kokubunji, both of Japan

[73] Assignee: Hitachi, Ltd., Tokyo, Japan

[21] Appl. No.: 131,741

[22] Filed: Oct. 5, 1993

[30] Foreign Application Priority Data

Oct. 13, 1992 [JP] Japan .................. 4-274041
Jun. 3, 1993 [JP] Japan .................. 5-133109

[51] Int. Cl.⁶ .................................. H01J 37/295
[52] U.S. Cl. .................................. 250/311; 253/307
[58] Field of Search .............. 250/311, 397, 442.11, 250/307

[56] References Cited

U.S. PATENT DOCUMENTS

| | | | |
|---|---|---|---|
| 4,382,182 | 5/1983 | Matsuzaka et al. | 250/311 |
| 4,596,934 | 6/1986 | Yanaka et al. | 250/442.11 |
| 5,004,918 | 4/1991 | Tsuno et al. | 250/311 |
| 5,153,434 | 10/1992 | Yajima et al. | 250/311 |

OTHER PUBLICATIONS

Journal of Applied Physics, vol. 69, No. 8, Apr. 1991, "Mapping Induction Distributions by Transmission Electron Microscopy", Chapman et al, pp. 6078–6083.

*Primary Examiner*—Bruce C. Anderson
*Attorney, Agent, or Firm*—Fay, Sharpe, Beall, Fagan, Minnich & McKee

[57] ABSTRACT

When observing a magnetization image on a magnetic thin film by means of a scanning transmission electron microscope, the effect of a stray magnetic field is made smaller than that of a magnetization in order to produce a clear magnetic structure of the magnetization image. To relatively reduce the effect of the stray magnetic field in comparison to that of the magnetization, the scanning transmission electron microscope is equipped with a specimen-holder driving means which can rotate the surface of a specimen 5 by more than 90 degrees with an axis parallel to the optical path of an electron beam 1 taken as a center and incline the surface of the specimen 5 around a center axis 22 perpendicular to an axis 24 rotated earlier over the surface of the specimen 5 with respect to a magnetic-recording track direction and also perpendicular to the axis parallel to the optical path of the electron beam 1. In the actual observation, however, a limit is put on the angle of rotation by which the surface of the specimen 5 is rotated with respect to the recording track direction.

9 Claims, 7 Drawing Sheets

FIG. 6A CROSS SECTION OF THIN FILM

FIG. 6B TRANSMISSION INTENSITY

FIG. 6C DIFFERENTIAL VALUE OF TRANSMISSION INTENSITY

FIG. 6D DIFFERENCE SIGNAL OF DETECTOR d(b)/dx

TRANSMISSION ELECTRON MICROSCOPE AND METHOD OF OBSERVING MAGNETIC PHENOMENA USING ITS APPARATUS

BACKGROUND OF THE INVENTION (1) Field of the Invention

The present invention relates to a transmission electron microscope and a method of observing magnetic phenomena by using its apparatus. To put it in more detail, the present invention relates to a scanning transmission electron microscope apparatus used for observing magnetic phenomena of magnetic substances by means of a transmission electron microscope equipped with a specimen chamber without or with sufficiently weak magnetic field and a method of observing the magnetic phenomena using the apparatus.

(2) Description of the Prior Art

The scanning transmission electron microscope can converge an electron beam into a very small point. Accordingly, by detecting a deflection due to a Lorentz force experienced by the electron beam during the transmission through a specimen (usually a magnetic film), the micro magnetic structure of the magnetic film can be examined with a very high degree of resolution. The transmission intensity of the electron beam can produce an image that can normally be obtained by means of an ordinary scanning transmission electron microscope. Since the angle of deflection of the electron beam is generally smaller than the illumination semi-angle of the incident electron beam hitting the specimen, a detector whose surface is divided into several parts is used for detecting the amount of deflection. Such a detector is called a differential phase contrast detector. By calculating differences among signals from each part of the detector, a signal representing the amount of deflection can be obtained. On the other hand, a signal representing the transmission intensity is produced by computing the sum of the signals from each part of the detector.

In the observation of the magnetic state (or the magnetization image) of a magnetic film, two big problems are encountered. One of the problems is that magnetization in the magnetic thin film is overshadowed and concealed by a stray magnetic field, which is inevitably unseen during the observation. As a result, the contrast of the magnetization cannot be obtained. In a magnetic recording device, for example, magnetizations opposite to each other known as recording bits are written as recorded data by a magnetic recording head onto a magnetic thin film which serves as a recording medium. On the other hand, recorded data is read out from the recording medium by detecting a change in stray magnetic field that leaks from a boundary between magnetized and unmagnetized portions on the thin magnetic film. The configuration of a magnetic recording device is shown in FIG. 8. As shown in the figure, the magnetic recording device comprises a plurality of magnetization regions 81. The magnetization regions 81 have been magnetized in directions indicated by solid-line arrows 82, representing information of recorded bits. Reference numeral 83 denotes stray magnetic fields generated in such directions that the magnetizations 82 of the magnetization regions 81 in the magnetic thin film are neutralized. An electron beam 1 passing through the center of a recording bit 81 is deflected by the magnetization of the magnetization region 81 and the corresponding stray magnetic field by about the same angles of deflection but in opposite angular directions. As a result, the electron beam 1 passes through the magnetization region 81 as if there were almost no deflection effect of the magnetization. As described earlier, the existence of a magnetic field is observed by measuring the amount of deflection. Since almost no deflection is detected, it is also difficult to detect the existence of the magnetic field.

The other problem is caused by contrast originating from crystallites in the magnetic image. With a Lorentz force not existing, an electron beam passing through a magnetic thin film is adjusted by using an imaging lens and a beam shift coil so that the electron beam reaches the center of a differential phase contrast detector. Adjustment is further carried out so that a signal representing differences in intensity among outputs from each part of the differential phase contrast detector becomes zero. With a magnetic field existing in a specimen, on the other hand, the electron beam is deflected by a Lorentz force. Accordingly, the intensities of signals hitting the detecting surfaces of the differential phase contrast detector vary. As a result, the direction and magnitude of the deflection experienced by the electron beam can be known. In general, the magnetic thin film serving as a magnetic recording film, a magnetic thin film of importance to the industry, is a polycrystalline film. The crystallites of a polycrystalline film have crystal orientations different from each other, exposing a variety of different scattering intensities to a passing electron beam. For an electron beam on a grain boundary, a distribution of intensities can thus be observed in a probe examining the passing electron beam. Thus, a signal appears in the differential phase contrast detector even if the electron beam experiences no deflection. In addition, an electrostatic potential is built up on the grain boundary and the gradient of the electrostatic potential also inevitably deflects a passing electron beam as well. Because of factors originating from crystallites, contrast is resulted in due to no magnetic origin. The contrast may, in turn, give rise in the magnetization image. In this case, it will thus be difficult to analyze in detail the state of an image representing the distribution of a magnetic field. As a result, it will also be hard to obtain a magnetization image with a high degree of resolution.

An effective solution to the first problem has not been found so far. In order to solve the second problem, techniques are adopted to reduce contrast caused by crystallites using a frequency filter. The frequency filter is used because spatial frequencies with different magnetic and crystallite structures exist. A typical technique is disclosed in the Journal of Applied Physics 69 (1991) 6078–6083, Mapping Induction Distributions by Transmission Electron Microscopy. With this technique, an electron beam is converged with a diameter of the order of 10 nm and then used for scanning over a specimen being observed. Subsequently, the deflection of the electron beam passing the specimen is observed by means of an eight-division detector. At that time, the spatial-frequency response function of the detector is varied in order to reduce contrast caused by crystallites. The technique of varying the response function is known as a modified differential phase contrast method. As a result, a cross-tie domain-wall of a permalloy thin film with almost no stray magnetic field can be observed at a resolution of the order of the beam diameter and magnetic induction mapping can also be carried out as well. The above conventional modified differential phase contrast method for reducing contrast caused by crystallites has a shortcoming that, since a spatial-frequency filter is employed in the method, spatial-frequency information removed out by the filter is inadvertently lost even if the information is also to be observed. That is to say, it is impossible to reduce only the contrast caused by crystallites due to the fact that the spatial frequencies with different magnetic and crystallite structures do not necessarily exist. In the case of observation of a magnetic recording medium with small interaction among its crystallites, in particular, magnetization ripples in the medium are considered to occur in crystallite units so that the ripples are also reduced as well by the spatial-frequency filter. As a result, fine observation becomes impossible.

SUMMARY OF THE INVENTION

It is an object of the present invention to provide a method of image observation and a transmission microscope apparatus wherein a beam passes through a specimen being observed and an image obtained from the deflection and intensity of the beam can be observed with ease and with a higher degree of resolution.

It is another object of the present invention to provide a scanning transmission electron microscope and a magnetization-image observation method allowing a magnetization image of a magnetic thin film with adequate magnetic contrast to be obtained regardless of the intensities of stray magnetic fields in the observation of the magnetization image.

It is still another object of the present invention to provide a image processing method and a scanning transmission electron microscope which can reduce contrast appearing in a differential phase contrast image caused by crystallites without affecting the magnetic contrast.

In order to achieve the object described above, the present invention provides a scanning transmission microscope with the observation steps of:
  applying a beam to a specimen being observed; passing the beam through the specimen;
  detecting the transmission intensity and the amount of deflection of the beam leaving the specimen;
  varying the incidence position of the beam on the specimen along scanning lines;
  arranging signals representing the transmission intensity and the amount of deflection in accordance with incidence positions of the beam; and
  creating a signal of a scanned image, wherein, in applications with a magnetic thin film observed as a specimen and an electron beam serving as the beam cited above, the scanning transmission electron microscope is designed to include a specimen holder allowing the surface of the specimen to be oriented three-dimensionally at any arbitrary angle. In other words, the scanning transmission electron microscope is equipped with a sample-holder driving means that allows the specimen to be rotated over a plane parallel to the surface of the magnetic thin film and the surface to be inclined, creating any arbitrary angle with the optical path of the electron beam.

In order to achieve the other object described above, the scanning transmission electron microscope is designed to include a signal processing circuit for obtaining a signal of the scanned image from the transmission intensity and the amount of deflection of the beam passing through the specimen and a means for deducting a product of a constant and a signal obtained by differentiating a signal representing the transmission intensity in a direction, in which the deflection of a signal representing the amount of deflection is detected, from a differential phase contrast image.

According to the method of observing a magnetization image further provided by the present invention, the amount of deflection and the transmission intensity of the beam passing through a specimen are detected by means of a differential phase contrast detector. In the observation technique for obtaining a magnetization image of a specimen, signal processing is carried out for subtracting the differential of a sum-signal image output by the differential phase contrast detector from the differential phase contrast which is obtained from a difference signal output by the differential phase contrast detector.

DESCRIPTION OF THE PREFERRED EMBODIMENTS

The present invention will be apparent from the following detailed description of preferred embodiments with reference to accompanying diagrams.

Figure 1:
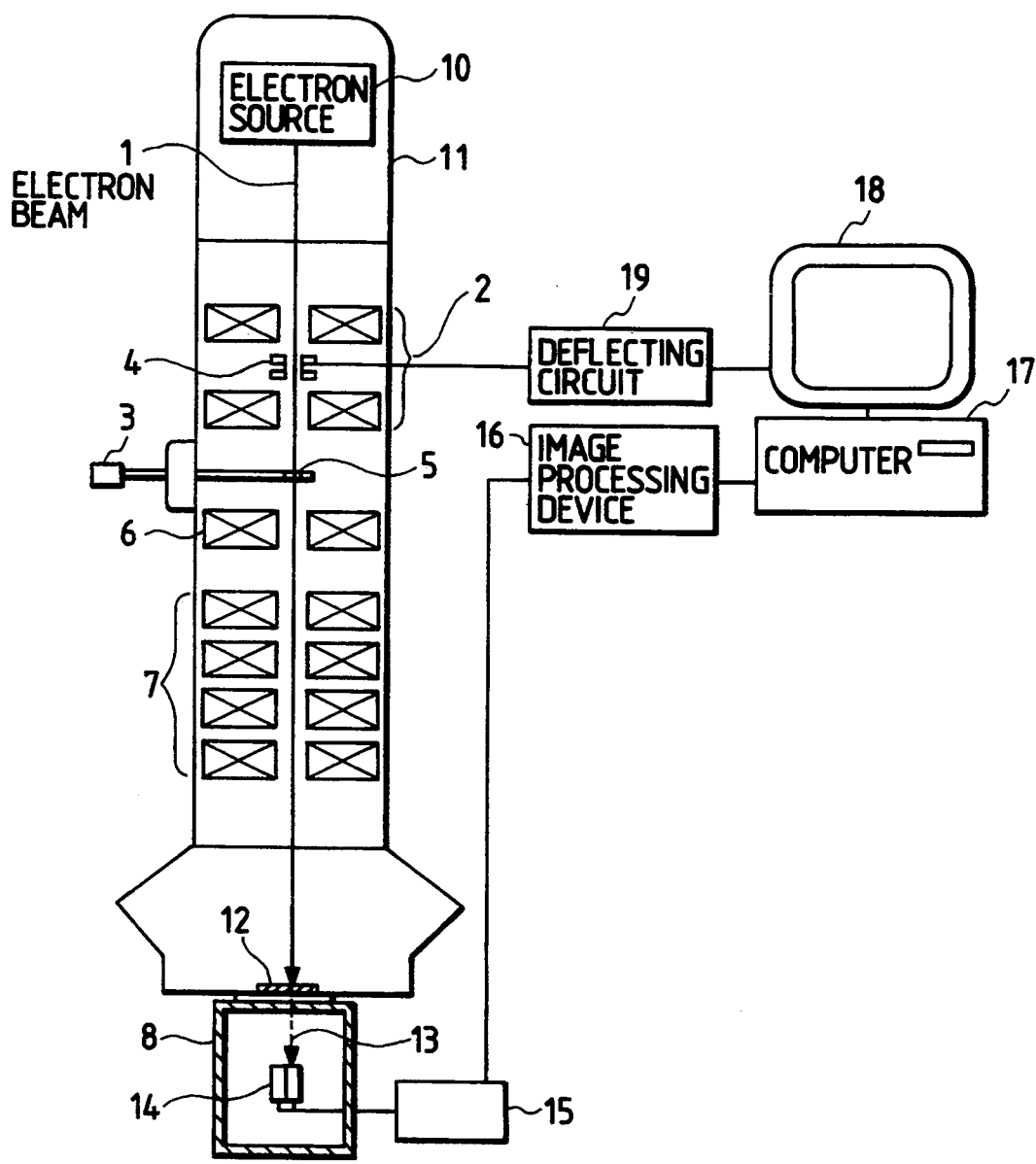
FIG. 1 is a block diagram showing the configuration of an embodiment implementing a scanning transmission electron microscope apparatus in accordance with the present invention.

FIG. 1 is a block diagram showing the configuration of an embodiment implementing a scanning transmission electron microscope apparatus in accordance with the present invention. As shown in the figure, the scanning transmission electron microscope comprises an electron source 10 for generating an electron beam 1, a set of electrostatic and electromagnetic lenses for accelerating, converging and scanning the electron beam 1 further comprising illumination lenses 2, a deflector 4, objective lenses 6 and image-formation lenses 7, and a deflection detector 8 for detecting the amount of deflection of the converged electron beam 1 after passing through a magnetic thin film 5 (a specimen being observed), wherein a specimen holder for holding the magnetic thin film 5 can be rotated over a plane parallel to the surface of the magnetic thin film 5 and the surface of the magnetic thin film 5 can be inclined with respect to the electron beam 1 by a specimen-holder driving apparatus 3. In this embodiment, the specimen mounting unit of the specimen holder for holding the magnetic thin film 5 is removed from a location between the objective lenses 6 and, instead, installed between the illumination lenses 2 and the objective lenses 6 so that the surface of the magnetic thin film 5 can be rotated and inclined in a process of producing an observable magnetic-recording image.

After passing through the specimen 5, the electron beam 1 is enlarged by the image-formation lenses 7 to a spot with a proper size, hitting a scintillator 12 placed at the bottom of an electron-microscope column 11. A light beam emitted by the scintillator 12 is lead to a vacuum chamber outside the electron-microscope column 11 where the light beam is applied to a four-divided detector 14 employed in a detector 8. The four-divided detector 14 is used for detecting the amount of deflection of the electron beam 1. A signal output by the detector 14 is processed by an arithmetic circuit 15 and an image processing apparatus 16 and then stored in a storage unit of a computer 17 which is also equipped with a display unit 18. Reference numeral 19 is a beam deflecting circuit for scanning the electron beam 1 over the specimen 5 and for scanning signal of the display unit 18.

Figure 2:
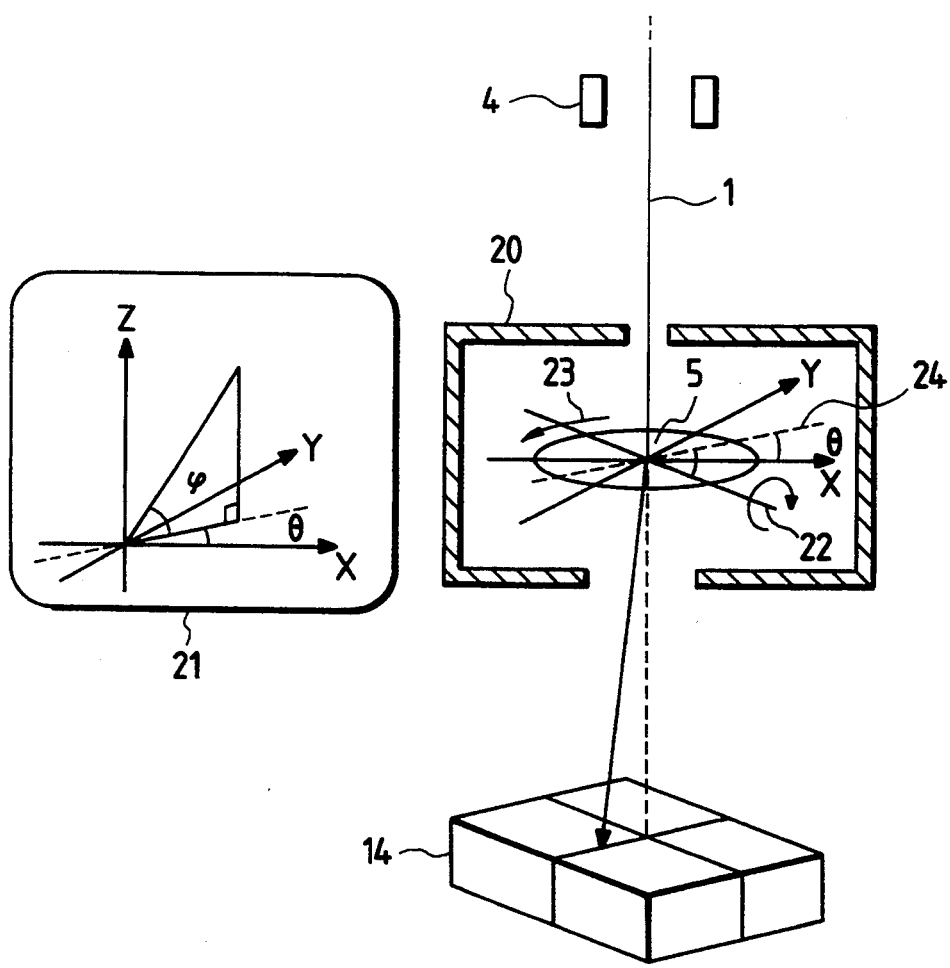
FIG. 2 is a diagram showing a relation between positions of a deflection detector and a specimen in the embodiment implementing a scanning transmission electron microscope apparatus in accordance with the present invention.

FIG. 2 is an enlarged diagram showing a relation between positions of the detector 14 and the specimen 5 in the embodiment implementing a scanning transmission electron microscope apparatus in accordance with the present invention. The figure also shows the configuration of main elements constituting the transmission electron microscope and is used for explaining changes in contrast of a magnetization image caused by the rotation and inclination of the specimen 5. As shown in FIG. 1, the deflected electron beam 1 hits the scintillator 12, being converted into light which is then supplied to the detector 14. In order to simplify the explanation, a typical detector for converting the electron beam 1 into an electrical signal is assumed in the following explanation. A specimen mounting unit for holding the magnetic thin film 5 (not shown in the figure) is placed in a specimen chamber with a weak magnetic field of 0.1 Oe or smaller. The specimen chamber is enclosed by a magnetic shield 20 made of a permalloy.

A rectangular coordinate system 21 comprising X, Y and Z axes is shown on the left side of the figure. A plane created by the X an Y axes is perpendicular to the Z axis. The electron beam 1 travels along the Z axis, entering the specimen 5. The deflector 4 lets the electron beam 1 scan the X-Y plane. The specimen holder can be inclined the surface of the specimen 5 three-dimensionally with respect to the electron beam 1. To put it in more detail, the surface of the specimen 5 can be rotated with the Z axis taken as a center and inclined with respect to the Z axis. Observation of a magnetic recording image of bit information recorded in the magnetic thin film 5 is described as follows. By inclining the surface of the specimen 5 with an axis 22 taken as a center by an angle of inclination $\psi$, the surface of the specimen 5 can be inclined with respect to the electron beam 1. The axis 22 is perpendicular to an axis 24 as well as to the Z axis which is parallel to the optical path of the electron beam 1. The axis 24 is an axis rotated earlier by an angle of rotation $\theta$ over a plane parallel to the surface of the specimen 5 with a recording track direction taken as a reference. The recording track direction is a direction in which information is written on the magnetic thin film 5.

When observing a magnetization image of the specimen 5, the specimen holder is first rotated so that the direction of the recording tracks in the specimen 5 gets parallel to the axis 22. In other words, the axes 22 and 24 which are perpendicular to each other are rotated over a rotation angle of 90 degrees so that the axis 24 is arranged perpendicularly to the direction of the recording tracks. The specimen holder is then rotated with te axis 22 taken as a center in order to incline the surface of the specimen 5. Furthermore, the deflection detector 14 is rotated so that a direction perpendicular to the axis 22 coincides with a direction in which the deflection detector 14 exhibits a strongest sensitivity.

Figure 3A:
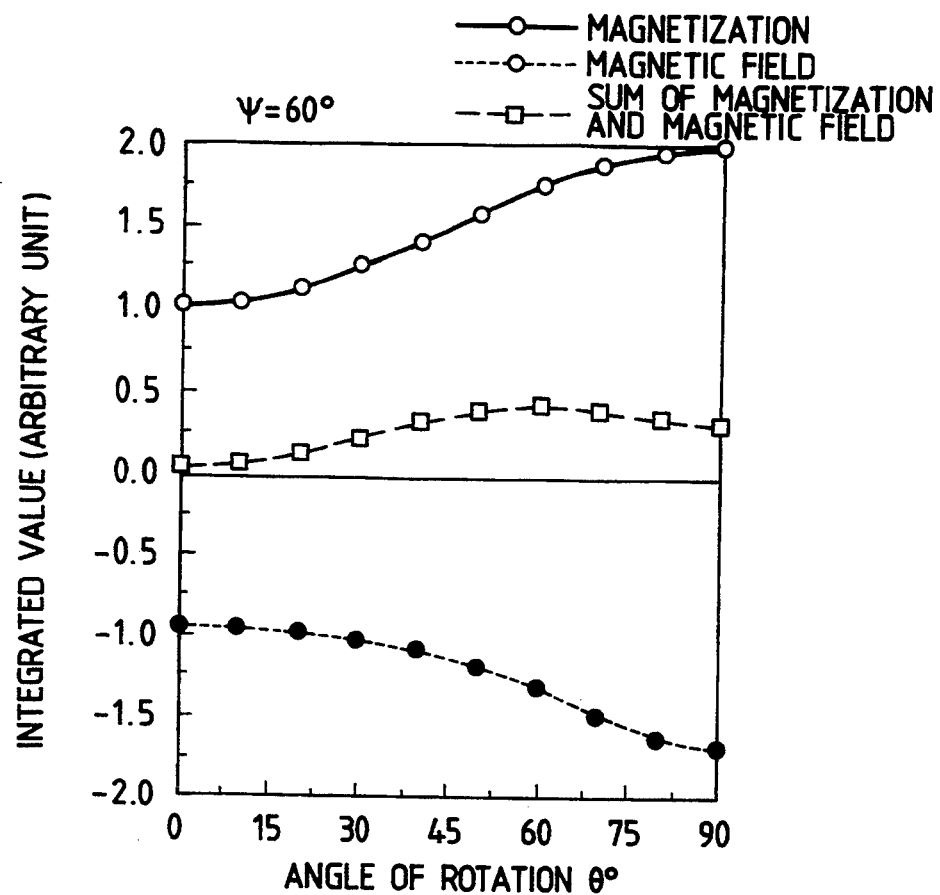
FIGS. 3A and 3B are diagrams illustrating graphs showing dependence of values obtained by integrating orthogonal line components (X and Y respectively) of the stray magnetic fields and magnetizations representing a magnetic recording bit upon the rotation angle.
Figure 3B:
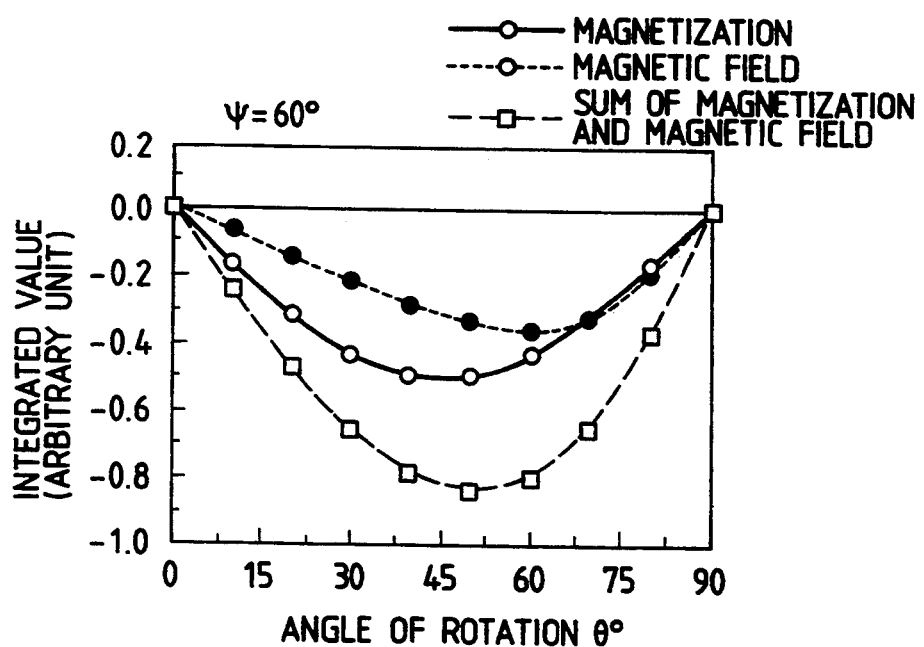

The horizontal axes of FIGS. 3A and 3B represent the angle of rotation $\theta$ of the surface of the magnetic thin film 5. The angle of rotation $\theta$ is varied with the angle of inclination $\psi$ remaining unchanged. The angle of inclination $\psi$ is an angle formed by the electron beam 1 and the inclined surface of the magnetic thin film 5. The vertical axes of FIGS. 3A and 3B represent integrated values of intensities of a stray magnetic field and magnetization generated in a recording-bit region as a magnetization image as well as sums of both the integrated values. The integrated values are obtained by integrating the intensities of the stray magnetic field and the magnetization along the path of the electron beam 1 passing through the center of the recording bit. The figures show distributions of the stray magnetic field and magnetization over angles of rotation. The distributions are caused by changes in magnitude of a Lorentz force experienced by the electron beam 1 passing through the inclined specimen 5. FIGS. 3A and 3B represent two orthogonal components obtained by splitting the integrated values. The two orthogonal components correspond to the detector's detection directions X and Y respectively. The data shown in the figure was taken with an angle of inclination $\psi$ of 60 degrees, a recording-bit track width of 10 $\mu$m and a recording density of 20 kFCI. The angle of rotation $\theta$ is measured with a direction parallel to the recording-track direction taken as a reference. At an angle of rotation $\theta$ of 0 degrees, or with the axis 24 oriented in a direction parallel to the track direction, Lorentz's forces generated by the stray magnetic field and magnetization in the X direction are almost equal to each other. In this case, Lorentz's forces generated by the stray magnetic field and magnetization in the Y direction are both zeros. As the angle of rotation $\theta$ is increased, however, the effect of the magnetization in the X direction gets greater than that of the stray magnetic field. In the Y direction, the effects of the magnetization and the stray magnetic field are both increased. Unlike the effects in the X direction, however, the effects in the Y direction increase both in the negative direction, mutually strengthening each other. As the angle of rotation $\theta$ is further increased to a value where the axis 24 becomes almost parallel to the recording-track direction, the components in the Y direction disappear, leaving only the components in the X direction. At this angle of rotation, the effect of the magnetization in the X direction is about four times greater in magnitude than that of the stray magnetic field. The difference in integrated value between the magnetization and the stray magnetic field affects the final amount of deflection of the electron beam 1. In addition, the deflection direction is determined by the resultant of the X and Y directions. Accordingly, by observing the magnetization image at angles of rotation in close proximity to 90 degrees, the deflection direction and information of a magnetic-recording bit can be obtained correctly because the stray magnetic field is relatively weak in comparison to the magnetization. That is to say, the magnetization contrast can be obtained.

Figure 4A:
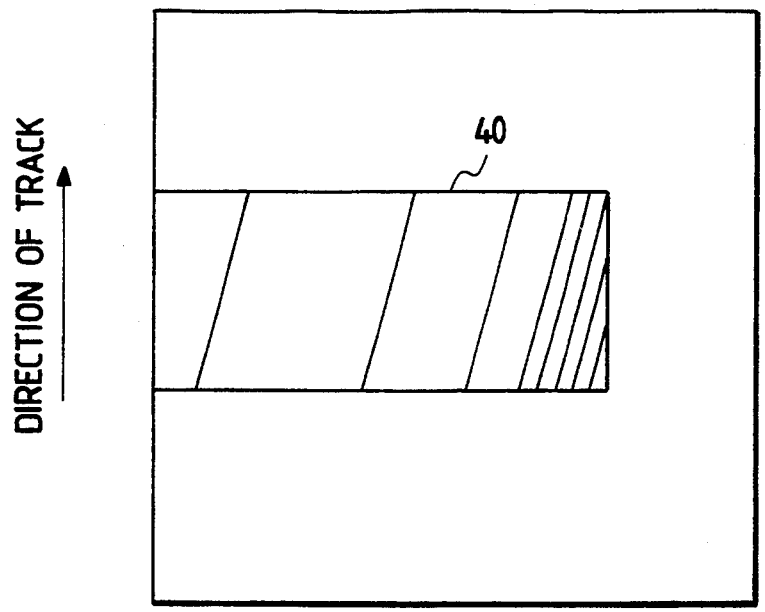
FIGS. 4A and 4B are model diagrams of magnetization images observed by the scanning transmission electron microscope with a specimen rotated but not inclined and a specimen rotated as well as inclined respectively.
Figure 4B:
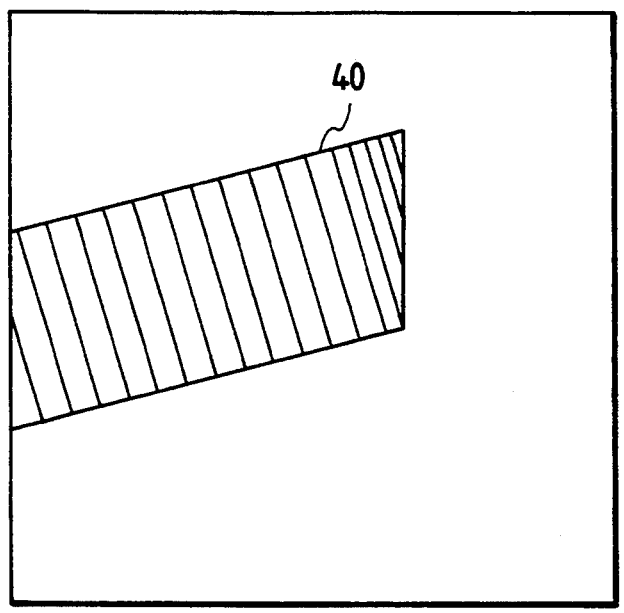

FIGS. 4A and 4B are model diagrams of magnetization images observed by the scanning transmission electron microscope. FIG. 4A shows a magnetization image obtained with a specimen 5 rotated but not inclined whereas FIG. 4B shows an image obtained with the specimen 5 rotated as well as inclined. In particular, these figures also show portions at the edges of magnetic-recording images of 1-bit information. FIG. 4A shows a magnetization image with the electron beam passing through the magnetic thin film 5 perpendicularly as is the case with the conventional transmission electron microscope. On the other hand, FIG. 4B shows a magnetization image observed at the same location as that of FIG. 4A but with the surface of the magnetic thin film 5 inclined. Hatched portions of the diagrams shown in the figures denote a magnetic-recording bit 40 which has been magnetized in a direction opposite to that of the surroundings. The density of the hatched portions represents the intensity of the magnetic contrast. The data shown in the figures was observed from a CoPt magnetic thin film with a thickness of 40 nm, a recording density of 5 kFCI and a bit length of about 5 $\mu$m.

In the case of the magnetic-recording bit 40 shown in FIG. 4A, leaking to the outside of the end portion, the stray magnetic field is weakened at the end portion of the magnetic-recording bit 40. The bit formation at the end portion can be seen with sufficient contrast. In the middle of the magnetic-recording bit 40, however, the deflection component caused by the stray magnetic field neutralizes that produced by the magnetization, giving rise to almost no contrast. In the case of the magnetic-recording bit 40 shown in FIG. 4B, on the other hand, the magnetization image was observed at an angle of rotation $\theta$ of about 80 degrees (with a direction parallel to the recording track taken as a reference) and an angle of inclination $\psi$ of approximately 60 degrees. Since the surface of the magnetic thin film is inclined, the form of the magnetic-recording bit 40 is inevitably distorted. However, the magnetic contrast is resulted in also in the middle of the magnetic-recording bit 40. That is to say, by properly selecting an angle of rotation $\theta$ and an angle of inclination $\psi$ for the specimen 5, a magnetization image created by magnetic recording with even a strong stray magnetic field can be observed.

In addition, since the proper values of the angle of rotation $\theta$ and the angle of inclination $\psi$ for the specimen 5 are known in advance, the distortion of the magnetic-recording bit 40 can be eliminated by image processing carried out by means of a computer. The image processing circuit can be designed so that a magnetization image can be displayed by taking the angle of rotation $\theta$ and the angle of inclination $\psi$ of the specimen 5 into consideration from the beginning. As a result, a distortionless magnetization image can be observed directly with sufficient contrast.

The above embodiment has been explained by assuming an angle of inclination of 60 degrees. It should be noted, however, that the angle of inclination is not limited to this particular value. As a matter of fact, at an angle of rotation $\theta$ in close proximity to 90 degrees, the closer the angle of inclination $\psi$ to 90 degrees, the smaller the relative effect of the stray magnetic field in comparison to that of the magnetization. The scanning transmission electron microscope apparatus allows the angle of rotation $\theta$ and the angle of inclination $\psi$ to be selected arbitrarily depending upon, among other factors, the thickness of the magnetic thin film, a specimen being observed.

Figure 5:
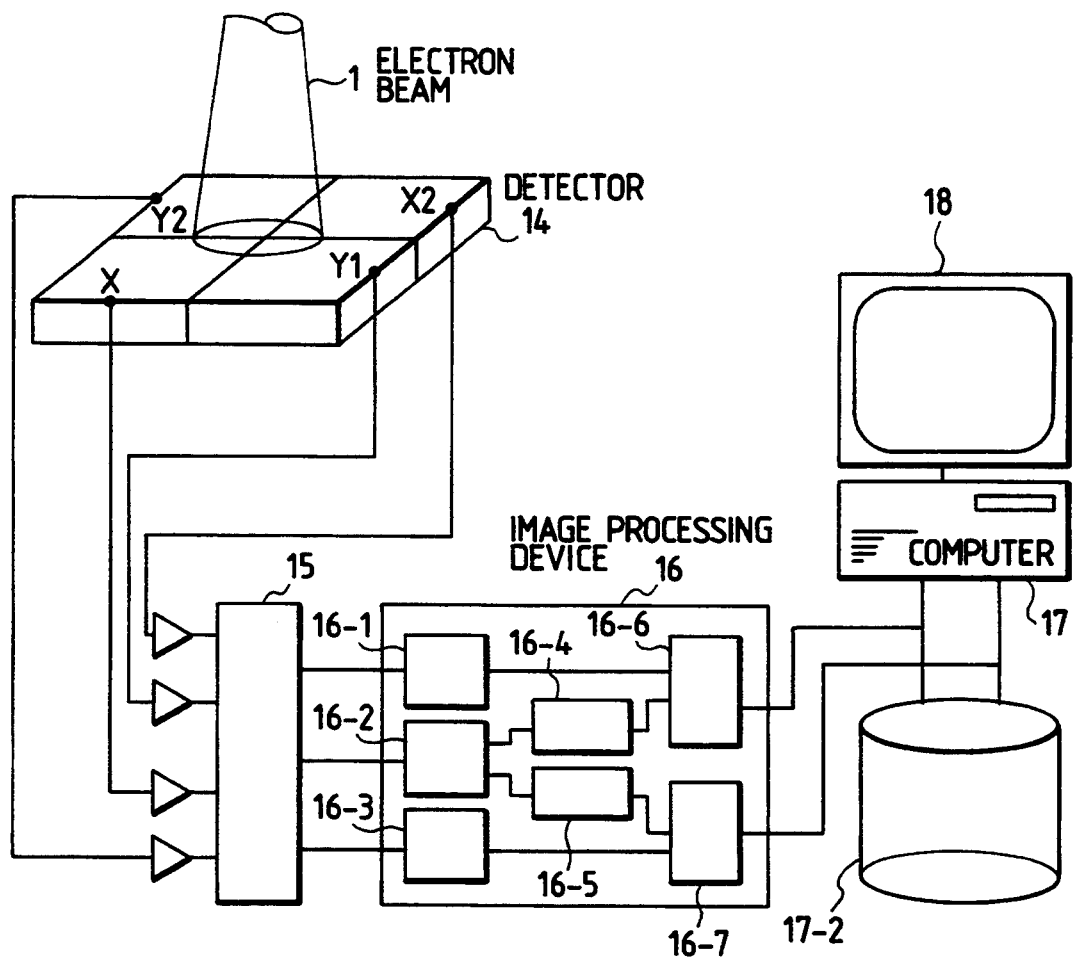
FIG. 5 is a block diagram showing the configuration of an image processing unit employed in the scanning transmission electron microscope provided by the present invention.

FIG. 5 is a block diagram showing the configuration of an image processing unit employed in the scanning transmission electron microscope provided by the present invention, comprising components ranging from the detector 14 to the image display unit 18 shown in FIG. 1. It has been discovered that the intensity of a difference signal representing the distribution of transmission intensities in the electron beam 1 passing through the specimen 5 is strongly related to the differential of a sum signal representing the total transmission intensity. The transmission intensities depends upon the orientation of the crystal passed through by the electron beam 1. The boundaries between crystal orientations is observed bluntly due to the fact that the electron beam 1 is spread. The differential of the transmission-intensity distribution very well resembles a difference signal output by a differential phase contrast detector normalized by transmission intensity. Accordingly, by subtracting a product of a constant and the differential of the transmission intensity from a differential phase contrast image, only contrast caused by crystallites can be reduced out off the differential phase contrast image. Since the magnetic field does not change the transmission intensity of the electron beam 1, the differential of the total transmission intensity does not include information on the magnetic field. The signal processing apparatus 16 shown in FIG. 5 implements the principle described above.

The transmission electron beam 1 hits the four-division differential phase contrast detector 14. At that time, the intensity of the electron beam 1 is converted into an electrical signal which is supplied to the arithmetic circuit 15. At the arithmetic circuit 15, the following operations are carried out:

Sum signal W = X1+X2+Y1+Y2

Difference signal Xs = {X1+Y1−(X2+Y2)}/sum signal W

Difference signal Ys = {X1+Y2−(X2+Y1)}/sum signal W where X1, X2, Y1 and Y2 are signals representing intensities output by the four detecting surfaces of the detector 14.

The sum signal W as well as the difference signals Xs and Ys are stored as scanned images in a W-sum-signal memory unit 16-2, an Xs-difference-signal memory unit 16-1 and a Ys-difference-signal memory unit 16-3 of the image processing apparatus 16. Later on, the sum signal W is differentiated by an X-direction differentiating circuit 16-4 and a Y-direction differentiating circuit 16-5 in X and Y directions in which the difference signals Xs and Ys have been computed respectively. Results of the differentiations are subtracted from images obtained from the difference signals Xs and Ys by subtraction circuits 16-6 and 16-7 respectively. In actuality, it is products of a constant and the differentials of the sum signal W that are subtracted from the difference signals Xs and Ys to give minimum deviation. Once the constant has been determined, however, it can be used as a parameter common to subsequent processings in observations using the same magnification factor.

Signals processed by the image processing apparatus 16 are stored in a magnetic storage unit 17-2 and output to the display unit 18. In addition to the processing functions described above, the image processing apparatus 16 also has functions for smoothing an image, carrying out spatial-frequency processing and the like which allow the image processing to be performed in an optimal way.

Figure 6:
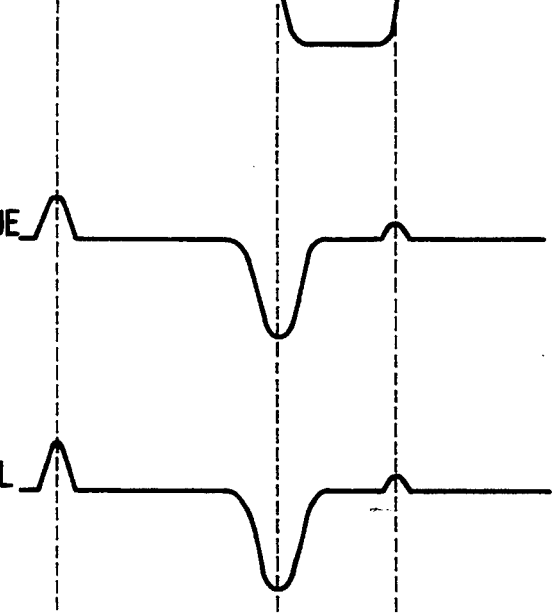
FIGS. 6A, 6B, 6C and 6D are explanatory diagrams used for describing signal waveforms produced by a differential phase contrast detector cited in the explanation of the operation of the present invention and a differentiated waveform.

FIGS. 6A, 6B, 6C and 6D are explanatory diagrams used for describing signal waveforms produced by a differential phase contrast detector 14 cited in the explanation of the operation of the present invention and a differentiated waveform. A cross section of a magnetic thin film is shown in FIG. 6A. The distribution of transmission intensities of an electron beam passing through such a magnetic thin film is dependent upon orientations of the crystal. As shown in FIG. 6B, the distribution of transmission intensities is particularly blunt on the boundaries between the crystal orientations due to the fact that the electron beam is spread thereon. A curve obtained by differentiating the distribution of the transmission intensities is shown in FIG. 6C. It is obvious that the curve shown in FIG. 6C very well resembles the waveform of a difference signal output by the differential phase contrast detector 14 normalized by transmission intensity as shown in FIG. 6D. Accordingly, by subtracting a product of a constant and the differential of the crystal's transmission intensity from the differential phase contrast images Xs and Ys, only contrast caused by crystallites can be reduced out off the differential phase contrast images Xs and YS. Since the magnetic field does not change the transmission intensity of the electron beam 1, the differential of the total transmission intensity does not include information on the magnetic field. As a result, the signal processing provided by the present invention has no effects at all on the information on the magnetic field.

Figure 7:
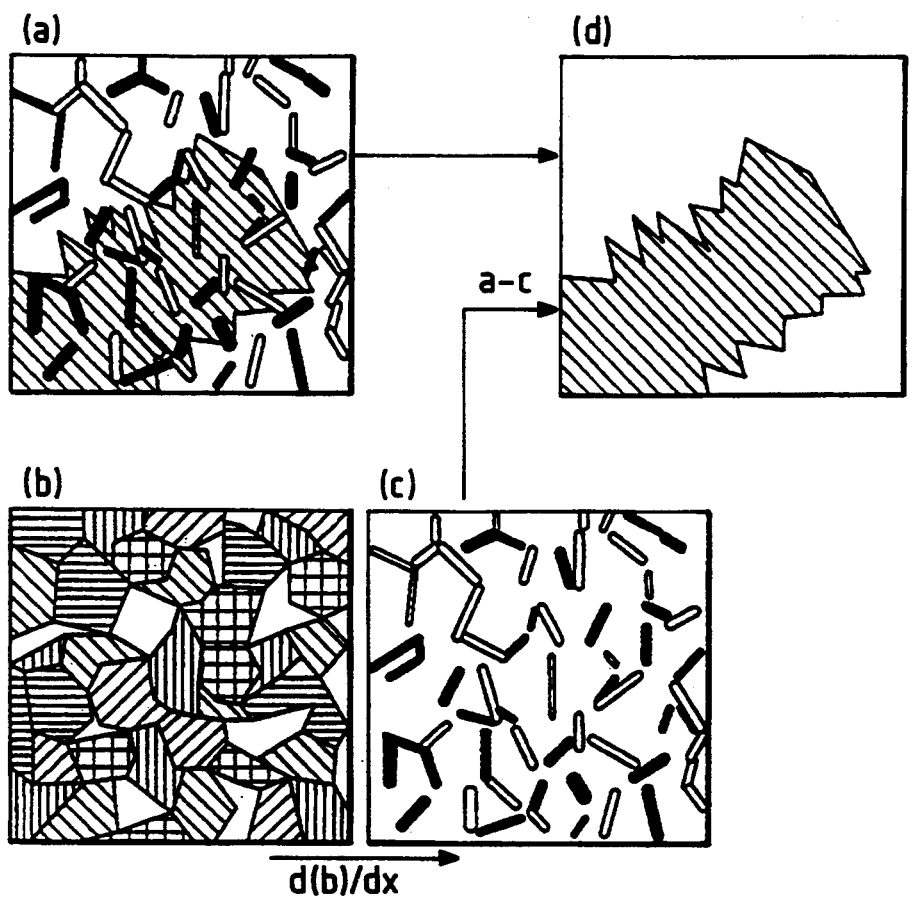
FIGS. 7(A–D) show model diagrams of magnetization images observed in the scanning transmission electron microscope provided by the present invention.
Figure 8:
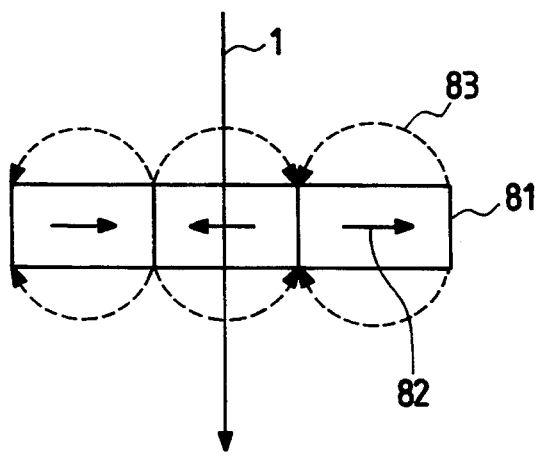
FIG. 8 is a diagram showing a relation between magnetizations and stray magnetic fields as seen in a direction perpendicular to the cross section of a magnetic thin film.

FIG. 7 shows model diagrams of magnetization images observed in the scanning transmission electron microscope provided by the present invention prior to and after the image processing described above.

The specimen used for obtaining the magnetization images shown in the figure is a magnetic thin film of the cobalt family in which a recording bit has been written. FIG. 7(a) shows a difference-signal image prior to the subtraction of the differential of a sum signal. FIGS. 7(b) and (c) show a sum-signal image and a differential image of the sum signal respectively. FIG. 7D shows a difference-signal image obtained by subtracting the differential image of the sum signal shown in FIG. 7(c) from the difference-signal image prior to the subtraction shown in FIG. 7(a). The difference-signal image prior to the subtraction shown in FIG. 7(a) is not a clear image of the recorded bit because it contains contrast originating from crystallites in addition to the image of the recorded bit itself. The structure of grains other than the image of the recorded bit itself very well resembles the differential image of the sum signal shown in FIG. 7(c). Accordingly, by subtracting the differential image of the sum signal shown in FIG. 7(c) from the difference-signal image prior to the subtraction shown in FIG. 7(a), only the image of the recorded bit can be displayed clearly. Prior to the subtraction, the differential image is multiplied by a constant which varies depending upon the gain of an amplifier used for obtaining the sum-signal image. In the embodiment described above, only a differential in a real space is used in the differentiation of the sum signal. It should be noted, however, that techniques of differentiation are not limited to the real-space differentiation. For example, a picture can be first manipulated in a frequency space prior to transformation into a real space to give the same effects as the differential in the real space. By transforming a picture completing frequency-space manipulation in this way, finer processing can be carried out.

The preferred embodiments provided by the present invention have been explained so far. It should be noted, however, that applications of the present invention are not limited to the preferred embodiments described above. For example, even though a four-divided differential phase contrast detector is employed in the embodiment, the same processing can be applied to a two-divided differential phase contrast detector or even to a multiple-divided one. In addition, although a differential phase contrast detector is employed in the embodiment, a detector capable of detecting positional shifts in center of gravity of the beam intensity can also be used for carrying out the same processing.

Moreover, in the embodiment, the differential of the sum signal is multiplied prior to the subtraction by a constant which is determined so as to give a minimum deviation. It should be noted, however, that the constant can also be selected to give the best image quality instead.

In the embodiments described above, a scanning transmission electron microscope is employed but a differential phase contrast detector using a transmission-type optical microscope can also be implemented as well.

What is claimed is:

1. A scanning transmission electron microscope comprising an electron source for generating an electron beam, electrostatic and electromagnetic lenses for accelerating, converging and scanning said electron beam, a detector for detecting an amount of deflection of said electron beam in passing through a magnetic thin film being observed and a specimen holder for holding said magnetic thin film, a specimen-holder driving means for rotating said specimen holder over a plane parallel to the surface of said magnetic thin film and for inclining said specimen holder so as to incline the surface of said magnetic thin film with respect to said electron beam.

2. A scanning transmission electron microscope according to claim 1 wherein said specimen-holder driving means is designed so that said specimen holder can be rotated over a plane parallel to the surface of said magnetic thin film by an angle of rotation of more than 90 degrees.

3. A magnetic-recording image observing method comprising the steps of:
   converging an electron beam toward a magnetic recording medium being observed;
   passing said converged electron beam through said magnetic recording medium;
   detecting an amount of deflection of said electron beam leaving said magnetic recording medium; and observing a magnetic-recording image recorded in said magnetic recording medium, said magnetic-recording image observing method characterized in that said amount of deflection of said electron beam is detected by rotating said magnetic recording medium over a plane parallel to the surface of said magnetic recording medium and inclining said magnetic recording medium with an axis perpendicular to an axis parallel to an optical path of said electron beam taken as a center.

4. A magnetic-recording image observing method according to claim 3 wherein said magnetic-recording image is an image of a bit recorded on a recording track of said magnetic recording medium and, when observing said image of said bit, said magnetic recording medium is inclined around a center axis perpendicular to another axis completing rotation over the surface of said magnetic recording medium with said recording track direction taken as a reference and also perpendicular to said axis parallel to said optical path of said electron beam.

5. A magnetic-recording image observing method according to claim 4 wherein said other axis is rotated by an angle of rotation ranging from 70 to 90 degrees with said recording track direction of said bit image taken as a reference.

6. An image processing method for processing an image comprising the step of:
applying an electron beam on a thin magnetic film;
passing said electron beam through said thin magnetic film;
detecting a transmission intensity and an amount of deflection of said electron beam leaving said thin magnetic film; and
laying out detection signals representing said transmission intensity and said amount of deflection in accordance with locations on said thin magnetic film passed through by said electron beam to create a scanned image, wherein a product of a constant and a differential signal, obtained by differentiating said detection signal representing said transmission intensity in a direction of detecting a deflection of said detection signal representing said amount of deflection, is subtracted from said detection signal representing said amount of deflection in image processing.

7. An image processing method for processing an image according to claim 6 wherein said constant is determined so as to minimize image deviation.

8. A scanning transmission electron microscope comprising:
a means for applying an electron beam to a thin magnetic film being observed and passing said electron beam through said thin magnetic film;
a detector for detecting a transmission intensity and an amount of deflection of said electron beam leaving said thin magnetic film;
a means for varying a location on said thin magnetic film hit by said electron beam to create a scanning form;
a signal processing circuit for arranging detection signals output by said detector to represent said transmission intensity and said amount of deflection in accordance with locations on said thin magnetic film passed through by said electron beam and treating a scanned image as an image signal; and
a means for using a product of a constant and a differential signal, obtained by differentiating said detection signal representing said transmission intensity in a direction of detecting a deflection of said detection signal representing said amount of deflection, as a subtrahend which is subtracted from said detection signal representing said amount of deflection in image processing.

9. A scanning transmission electron microscope according to claim 8 wherein said detector is a multiple-division detector whose surface is divided into several parts.

* * * * *